United States Patent [19]

Schaller

[11] Patent Number: 4,730,390

[45] Date of Patent: Mar. 15, 1988

[54] METHOD AND DEVICE FOR MAKING OF ELECTRONIC DEVICES AND DEVICES MADE IN ACCORDANCE WITH THE METHOD

[75] Inventor: Werner Schaller, Blieskastel, Fed. Rep. of Germany

[73] Assignee: Schaller-Automation Industrielle, Blieskastel, Fed. Rep. of Germany

[21] Appl. No.: 851,322

[22] Filed: Apr. 11, 1986

[30] Foreign Application Priority Data

Apr. 11, 1985 [DE] Fed. Rep. of Germany ....... 3512978

[51] Int. Cl.$^4$ .............................................. H05K 3/30
[52] U.S. Cl. ........................................ 29/836; 29/841
[58] Field of Search ................. 29/825, 855, 832, 835, 29/836, 841

[56] References Cited

U.S. PATENT DOCUMENTS 4,667,401 5/1987 Clements et al. .................... 29/832

Primary Examiner—Timothy V. Eley
Attorney, Agent, or Firm—Michael J. Striker

[57] ABSTRACT

A flat conductor foil is used on which the circuit is etched upon. After equipping this conductor foil with electronic structural elements the conductor foil is folded at predetermined folding edges for adaptation to the device shape. For forming the housing element this circuit unit is sheathed with a plastically mountable hardening synthetic material. The housing element is thereby separated into housing partial parts in such a manner that the housing partial parts may be joined together into a closed housing element when folding the conductor foil. Thereby, the housing partial parts are mounted onto the folding segments of the plane, still unfolded, but equipped conductor foil, whereby (before the folding) folding pieces are obtained for the individual folding pieces which protect the structural elements and the soldering and stabilize the foil for the joining.

14 Claims, 10 Drawing Figures

METHOD AND DEVICE FOR MAKING OF ELECTRONIC DEVICES AND DEVICES MADE IN ACCORDANCE WITH THE METHOD

BACKGROUND OF THE INVENTION

The invention relates to a method for making of electronic devices, wherein a flexible conductor foil being provided with the etched circuit is folded at predetermined folding edges after complementing the foil with the electronic structural elements for adaptation to the device shape and that this circuit unit is inserted into a molding tool depicting the geometric device shape and is coated with a plastic hardenable synthetic material into a housing body.

With such a method it is known to cauterize a plurality of uniform circuits adjacent to each other and successively on the thin flexible conductor foil being wound off from the tape roller and to complement them with the electronic structural elements. After the complementing and soldering of the structural elements the individual circuits are manually torn out along a perforation defining the circuit outline and are subsequently folded along the folding edges. In contrast to the use of rigid conductor plates the foldable flexible conductor foils are advantageous in that the large face being occupied by the flat complemented circuit can be subdivided by folding and by superimposing the folding segment can be arbitrarily reduced.

With rigid conductor plates the individual circuit parts would have to be again separately connected with each other by means of electric wiring with such a subdivision, but this is eliminated with the flexible conductor foil.

However in order to prevent a damaging of the conductor paths as well as the soldered in structural elements and also the flexible conductor foil itself of a circuit on such a flexible conductor foil, the separating and folding of the circuits must be performed carefully with a corresponding amount of time. Furthermore, the folded flexible foil is not very form stable, so that the fixing of the circuit in the molding tool, wherein the sheathing with synthetic material occurs, for example, by means of polyurethane foam, is not so simple. Since the removal and folding and the insertion into the sheathing mold as well as the position fixing require the full skill of an operator, these operating steps can be performed automatically only with large efforts.

SUMMARY OF THE INVENTION

It is an object of the invention to substantially simplify the removal of the complemented and soldered foil circuit from the flexible conductor foil tape as well as the folding, the inserting of the circuit into the sheathing mold and the fixing of the circuit in the mold.

According to the invention the housing body shaped by the plastic hardenable synthetic material is separated into partial housing parts in such a manner that these partial parts are joined into a closed housing when folding the conductor foil, thus providing the possibility to imbed the electronic structural elements, which are in the range of the folding segment, into the partial housing parts before folding. For this purpose the housing partial parts are mounted as individual synthetic mold parts onto the folding segments of the flat still unfolded conductor foil, so that already before the folding, stiffened folding pieces are generated which protect the structural elements, the soldering and the foil itself and cand can be folded in a simple manner to the closed housing on the flexible folding strips without special care and skill.

The mounting of the housing partial parts can be automated so that a manual operation is no longer required.

A particularly advantageous subdivision of the housing body is provided since the superimposed engaging soldered sides of the folding segments are not only sufficiently stiffened and protected by the insulating intermediary layers, but also safely against accidental electrically conductive contact. Thus, the hitherto used special inserted insulating separating foils can be eliminated. While the insulating intermediary layers are designed relatively thin to obtain a space saving folding, the housing partial parts which sheath the structural elements are relatively thick walled because they simultaneously form the outer contours of the housing body, so that larger structural elements can be fully imbedded and protected before the folding.

Advantageously a synthetic foam, in particular polyurethane foam is used as a plastic, hardenable synthetic material, which is filled only into one of the two molding tool halves and which expands through openings of the conductor foil into the other mold tool half. The synthetic foam sheaths the structural elements particularly protective due to its softness without exerting a a pushing pressure to the apertured conductor foil and the structural elements during the filling of the hollow spaces. The opposite disposed jointly molded housing partial parts are also directly connected with each other by means of the openings, so that a particular adhering effect between the conductor foil and the synthetic is not necessarily required.

Due to the latch type connection of the housing partial parts of the housing body made, the housing partial parts together with the imbedded circuit folding segments are precisely fixed with respect to each other during folding and are simultaneously connected into a closed housing body.

A tension free easy folding of the folding segments being sheathed with the synthetic material can be obtained in accordance with the housing body, in that one folding step remains free between the adjacent plastic housing partial parts, whose width is adapted to the height of the intermediary insulating intermediary layers after folding.

When the conductor foil features is subdivided into a plurality rectangular folding segments by parallel and/or perpendicular extending folding strips and when plate like synthetic housing partial parts are mounted thereon, the folding segments of the conductor foil can be folded in a sandwich manner without additional measures into an electronic module.

When the housing partial parts are provided with molded in recesses at the complement side of the conductor foil into which the folding segments are folded in with smaller housing partial parts, a structural element may be tilted into any desired end position independent from the complementing from above of the flat conductor foils in this manner.

If the folding segments, which are to be inserted locally offset into the housing body with its mounted synthetic housing partial part, are connected with the remainder circuit on the connector foil by means of free tongue like connecting ribs, they can be freely disposed in any desired position and state.

In order to tighly seal the resulting separating joints to the outside as well as the free folding strips and, if need be, the tongue like connecting ribs and to reinforce the housing body which consists of the partial parts it is suggested to jacket the assembled housing partial parts by means of an outer device jacket made of synthetic material.

For this purpose the assembled housing body may be inserted into a premade outer housing, which is closed by a lid at the insertion opening, so that an inexpensive plastic injectinon molded housing or a metal deep drawing housing may be used.

The housing partial parts can be placed by means of the molding tool in a very simple manner onto the still flat but complemented conductor foil so that the folding segments are taughtly braced tightly on the folding strips as well as on the edge strip between the ribs of the molding tool halves being formed by a tear off perforation, whereby the individual folding segments are firmly arrested and the housing partial parts are provided with exact and clean edge limitation. The recesses in the molding tool halves on the complemented side and the soldered side of the conductor foil are adapted exactly to the required spatial contours for the individual folding segments, so that all structural elements maintain their fixed position exactly during the filling of the hollow mold spaces with plastic hardenable synthetic material and are thereby integrated into the sheathing synthetic material during the hardening of the synthetic material.

In view of the fact that the molding tool halves are combined for all folding segments to a common lower and upper total mold, all housing partial parts may be made simultaneously in a simple manner with a single mold.

If the conductor foil and the molding tool halves are provided with congruent centerings it is assured that the circuit segments are molded always exactly on the same position.

The invention will be explained in more detail in conjunction with exemplified embodiments illustrated in the drawings.

DETAILED DESCRIPTION OF THE PREFERRED EMBODIMENTS

Figure 1:
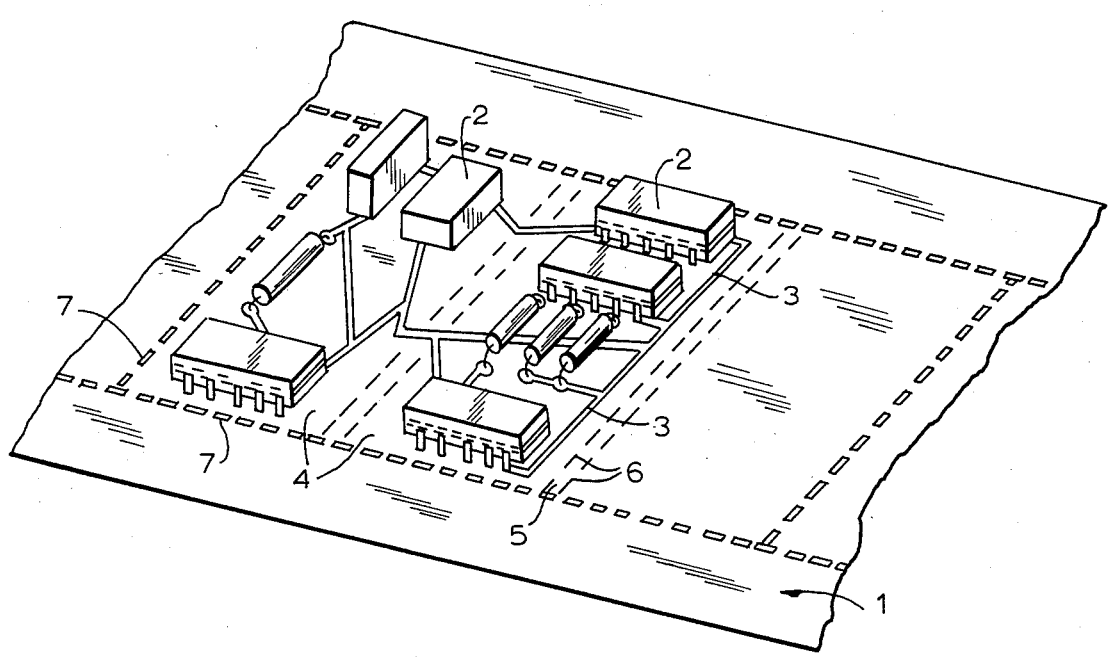
FIG. 1 shows a known conductor foil complemented with structural elements and folded.

The electric circuit consisting of the electronic structural elements 2 and the etched conductive paths 3 is mounted on the conductor foil 1 illustrated in FIG. 1. This known flexible circuit is provided with folding 5 for subdividing the individual folding segments 4, being marked by perforations 6 for facilitating the folding of the conductor foil 1. The outer edge of the circuit is formed by a tear off perforation 7.

Figure 2:
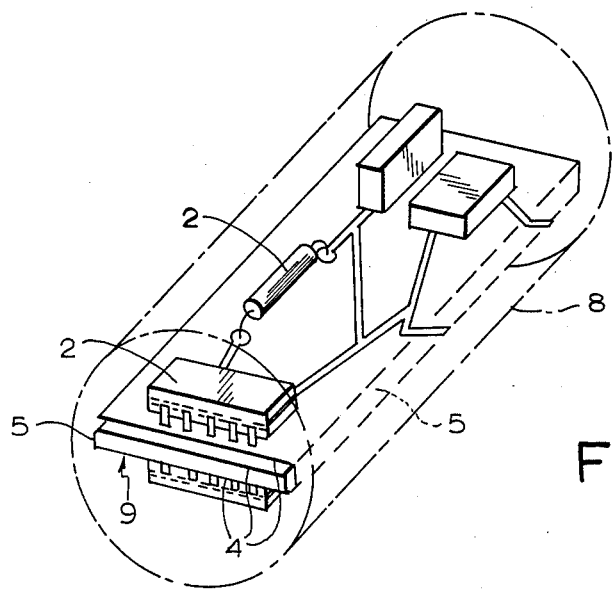
FIG. 2 shows the same known conductor foil, folded with indicated contours of the housing body to be mounted.
Figure 3:
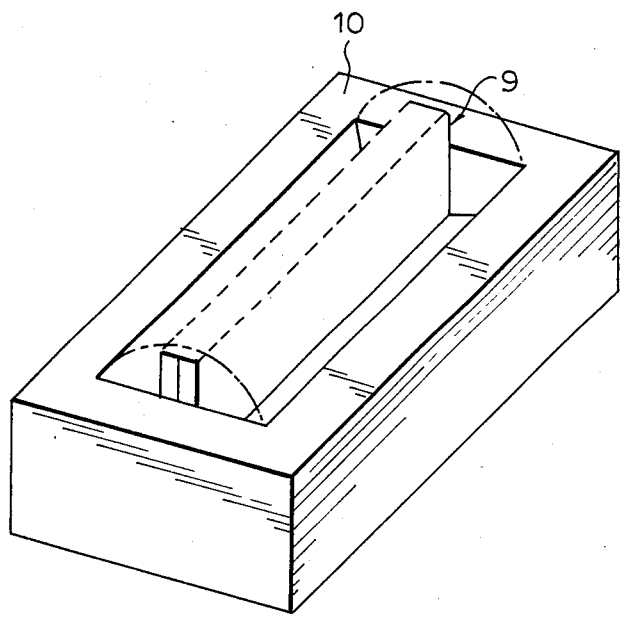
FIG. 3 shows the known folded circuit in accordance with FIG. 2 inserted into the lower mold half before sheathing.

FIG. 2 illustrates the circuit torn out of the conductor foil 1 with folding segments 4 which are folded on the folding strips 5, so that the individual folding segments are superimposed with the structural elements 2, so that the space requirement for the circuit is considerably reduced. The desired housing shape 8 of the electronic device which sheathes the folded circuit 9 is indicated by a dash-dotted line. FIG. 3 illustrates the known manual insertion of the folded circuit 9 into the lower molding tool half 10.

Figure 4:
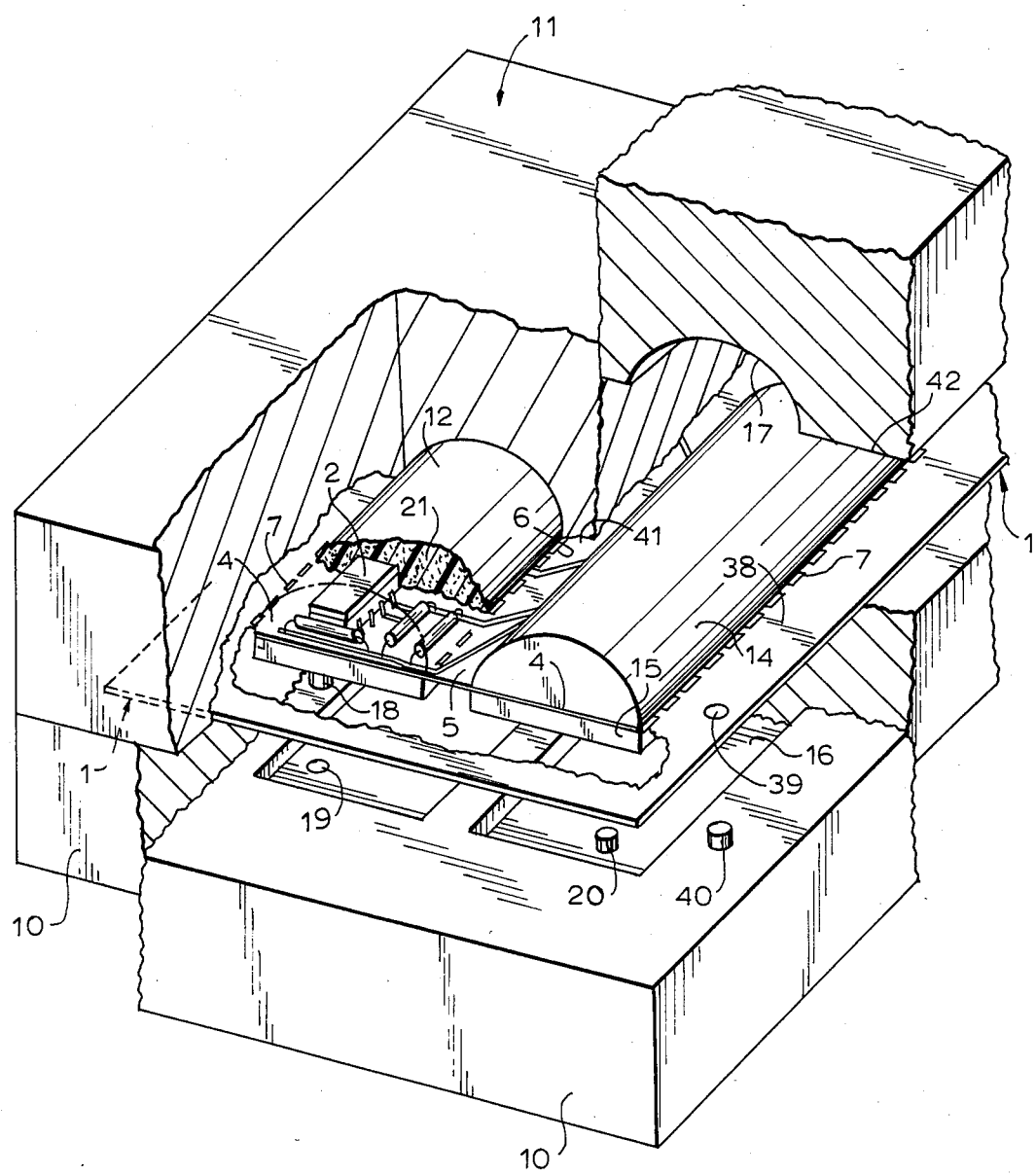
FIG. 4 shows two superimposed molding tool halves in a perspective illustration with intermediate braced complemented conductor foil after mounting the housing partial parts in accordance with the invention.

FIG. 4 illustrates the process in accordance with the invention for making the housing partial parts. The flat unfolded conductor foil 1 complemented with the structural parts is taughtly braced between the lower molding tool half 10 and the upper molding tool half 11. The conductor foil 1 supports the circuit formed by the folding segments 4, between which the folding strips 5 are provided with the two folding perforations 6. The outer limitation of the circuit is formed by the tear off perforation. The housing body of the electronic device is subdivided into the housing partial parts 12,13,14,15 which can be joined into a closed housing during the folding of the circuit.

For forming these housing partial parts the lower molding tool half 10 is provided with recesses 16 which form out the insulating layers 13 and 15. The upper molding tool half 11 supports semicylindrical recesses 17 in the range of the two folding segments 4 which form out the semicylinder partial parts 12 and 14 which are adapted to the outer contour of the housing body. For a better understanding the molding halves 10 and 11 are illustrated partially in a lifted position after the hardening of the synthetic material. For holding the two housing body halves 12,13 and 14,15 together after folding pins 18 are tip-stretched through molding holes 19 on the insulating intermediate layer 13, which engage in a clamping manner into latch holes being formed by the pins 20 of the lower molding tool half 10. A polyurethane foam 21 is provided as a synthetic material which protectively sheathes the structural elements 2. The complemented conductor foil 1 is provided with centering openings 39 on the edge strip 38 and the molding tool half 10 is provided with centering pins 40 which engage into corresponding bores of the other housing molding half 11. The molding tool halves are provided with inner ribs 41 and edge ribs 42 for a tight engagement of the two molding tool halves 10 and 11 on the folding strip 5 and the edge strip 38 of the conductor foil 1.

Figure 5:
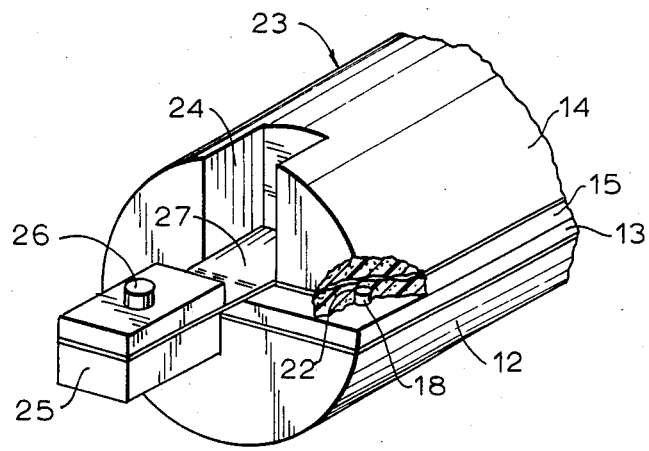
FIG. 5 shows the housing body made from the assembled housing partial parts removed from the mold in accordance with FIG. 4, shortly before inserting the last partial part.
Figure 6:
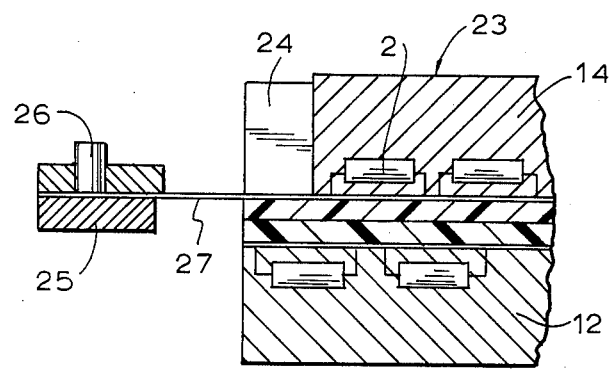
FIG. 6 shows a section through the housing body in accordance with FIG. 5 in the range of the still to be pivoted last partial part.

The circuit which had been separated from the molding tool illustrated in FIG. 4 along the tear off perforation 7 is joined into a cylindrical housing body, as illustrated in FIG. 5. The pins 18 of the insulating layer 13 engage into the holes 22 of the insulating intermediary layer 15 and hold the housing body 23 together in shape of a cylinder. The upper semicylinder partial part 14 supports a recess 34, into which the housing partial part 25 has to be pivoted. The housing partial part 25 sheathes the structural elements of a particular folding segment which is complemented in its flat condition of the conductor foil 1 with the structural elements 2, but should be inserted into the housing body 23 as a housing partial part turned by about 90° with respect to the other partial parts, so that, for example, a light diode 28 will be disposed to the outside into viewing range. The electrical connection of the housing partial part 25 with the remainder of the circuit is performed by the flexible conductor foil tongue 27 which is made by a special contour of the tear off perforation 7.

Figure 7:
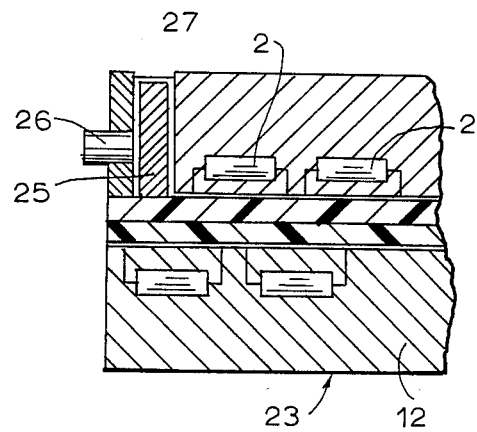
FIG. 7 shows a section in accordance with FIG. 6 with pivoted last partial part.
Figure 9:
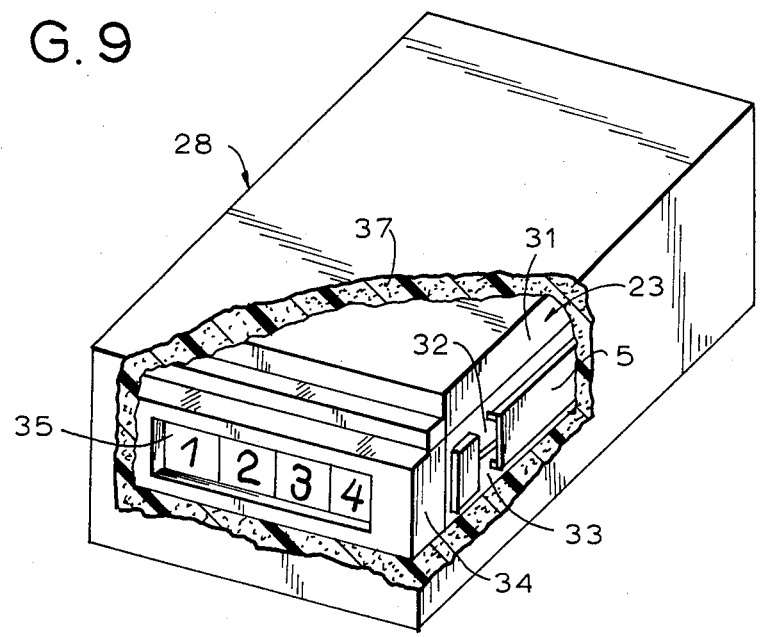
FIG. 9 shows the housing partial parts illustrated in FIG. 8 after the folding and mounting of an additional outer device jacket.

FIG. 9 illustrates the housing partial part 25 in a section before its is inserted into the recess 24 of the housing partial part 14. FIG. 7 illustrates the closed housing body 23 with inserted housing partial part 25, whereby the tongue 27 is folded in such a manner that the light diode 26 is disposed to the outside.

Figure 8:
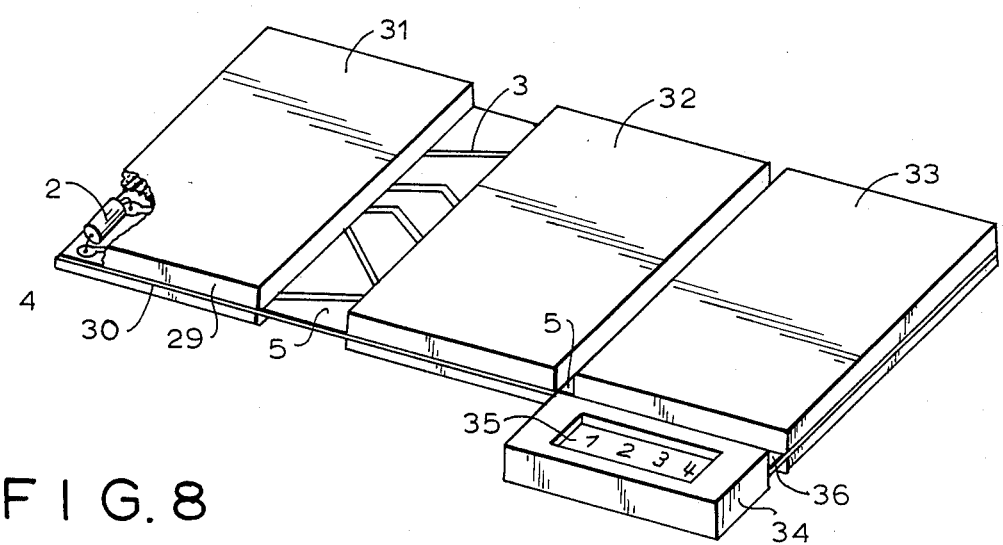
FIG. 8 shows square like housing partial parts of a housing body which sheath the successive disposed rectangular folding segments before folding.
Figure 10:
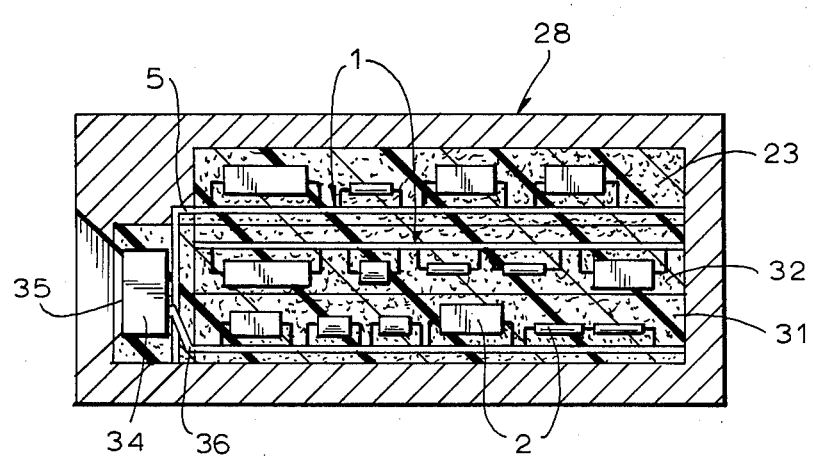
FIG. 10 the housing body in a cross section in accordance with FIG. 9.

FIGS. 8 to 10 illustrate one exemplified embodiment for an electric indicator device with a device outer jacket 28. The individual rectangular folding segments 4 with the structural element 2 are combined into flat, square like housing partial parts 31 to 34 by the synthetic foam layers 29 and 30 which are mounted from both sides, as illustrated in FIG. 8. While the housing partial parts 31,32 and 33 are disposed successively and have therebetween parallel extending folding strips 5 with connecting conductor paths 3, the housing partial part 34 is connected by means of a LED-indicator 35 and a folding strip 36, which extends rectangularly with respect to the remainder folding strips 5, with the remainder of the circuit.

FIGS. 9 and 10 illustrate the folded housing partial parts 31 to 33 in an accordeon like sandwich type structure, whereby the indicator partial part 34 is folded on the front face of the sandwich pack 31 to 33. The device outer jacket 28 which is provided for stiffening the housing body 23 and which encompasses the sandwich pack 31 to 34 is also formed by a foam layer 37.

I claim:

1. In a method for making electronic devices, comprising the steps of providing a flexible conductor foil provided with an etched printed circuit, complementing said foil with electronic structural components, providing folding segments on said foil, folding said foil at predetermined folding edges to adapt to a device shape and inserting said foil with said components into a molding tool having a geometric device shape, and sheathing said foil with a plastic hardenable synthetic material to obtain a housing body, the improvement comprising subdividing the housing body into housing parts in such a manner that the housing parts are joined to a closed housing body during the folding of the conductor foil and said housing parts are mounted as individual synthetic molding parts onto the folding segments of a flat and still unfolded but complemented conductor foil.

2. Method in accordance with claim 1, wherein the molding tool has molding tool halves which are automatically approximated to a moving foil tape complemented with soldered structural components of circuits at a complemented side and at a soldered side and are placed onto the folding segments, and subsequently a plastic synthetic material is inserted into hollow molding chambers of said molding tool, whereby the molding tool halves move along with a further movement of said tape during hardening of the synthetic material and thereafter open again automatically and are returned to an initial position thereof.

3. Method in accordance with claim 1, wherein the housing parts having outer contours of the housing body are mounted on the folding segments at a complemented side of the conductor foil, and at a soldered side of said foil insulating intermediary layers are mounted, and during said folding step the insulating intermediary layers on the folding segments are superimposed with respect to each other.

4. Method in accordance with claim 3, wherein a folding strip (5) remains free on the conductor foil (1) between the adjacent housing parts (12,14 or 13,15), a width of said strip being adapted to a height of the intermediary insulating layers (13,15) after folding.

5. Method in accordance with claim 1, wherein a synthetic foam material is used as said plastic hardenable synthetic material which is filled only into one of the molding tool halves, said conductor foil being provided with openings for the synthetic foam material in an inner range of the folding segments.

6. Method in accordance with claim 1, wherein said housing parts (12-15, 25; 31-34) of said housing body (23) are latchlike connected with each other during the joining step to the closed housing body of means of tipstretched extending pins (18) at engagement faces, and opposite mounted recesses (22) provided at said housing parts.

7. Method in accordance with claim 6, wherein the conductor foil (1) is subdivided into a plurality of rectangular folding segments (4) by folding strips (5), and said parts (31-33) of said housing body are plate-like and are mounted on said segments which are folded in a superimposed sandwich like manner into the closed housing body (23).

8. Method in accordance with claim 7, wherein said folding segments (4) to be inserted into the housing body (23) are locally displaced with a respective mounted housing part (25) and are connected with the remainder of the circuit (2,3) on the conductor foil (1) by means of free tongue like connecting ribs (27).

9. Method in accordance with claim 7, wherein the folding segments (4) of the flat and still unfolded but complemented conductor foil (1) is braced on the folding strips (5) and on an edge strip (38) formed by a tear off perforation (7) between inner and edge ribs (41,42) of the molding tool halves (10,11) and the molding tool halves are provided with recesses (16,17) on a complemented side and a soldered side of the conductor foil (1) in the range of the folding segments (4) being adapted to the contour of the housing parts (12-15) and limited by the ribs (41, 42) for receiving the plastic hardenable material (21).

10. Method in accordance with claim 9, wherein the molding tool halves (10,11) are combined into a common lower and upper total tool half for all folding segments (4).

11. Method in accordance with claim 9, wherein the complemented conductor foil (1) is provided with centering openings (39) at least in the folding and edge strips (5,38) and the molding tool halves (10,11) are provided with congruent centering pins (4) and centering bores.

12. Method in accordance with claim 6, wherein said parts (12,14) of the housing body (23) which are mounted at a complemented side (2) of the conductor foil (1) are folded with smaller housing parts (25).

13. Method in accordance with claim 6, wherein the housing parts (31-34) which are joined into the closed housing body (23) are jacketed by a plastic hardenable synthetic material forming an outer device jacket (28).

14. Method in accordance with claim 6, wherein the housing parts (12-15, 25; 31-34) which are joined into the closed housing body (23) are inserted into a premade outer housing and the outer housing is closed by a lid at an insertion opening.

* * * * *